(12) United States Patent
Brolin et al.

(10) Patent No.: US 7,576,997 B2
(45) Date of Patent: Aug. 18, 2009

(54) BACKPLANE EXTENSION APPARATUS AND METHOD

(75) Inventors: Stephen J. Brolin, Livingston, NJ (US); Albert Pedoeem, West Orange, NJ (US); Tom Chiodo, Oak Ridge, NJ (US); Willie Braun, Franklin Lakes, NJ (US)

(73) Assignee: Fujitsu Limited, Kawasaki (JP)

( * ) Notice: Subject to any disclaimer, the term of this patent is extended or adjusted under 35 U.S.C. 154(b) by 16 days.

(21) Appl. No.: 10/943,909

(22) Filed: Sep. 20, 2004

(65) Prior Publication Data

US 2006/0061977 A1 Mar. 23, 2006

(51) Int. Cl.
*H01R 12/16* (2006.01)

(52) U.S. Cl. .................. 361/788; 361/784; 361/796

(58) Field of Classification Search ............ 439/65, 439/60; 361/796, 788, 784; 385/135, 53, 385/88–89
See application file for complete search history.

(56) References Cited

U.S. PATENT DOCUMENTS

| | | | |
|---|---|---|---|
| 4,811,275 A * | 3/1989 | Balogh et al. ............... 710/316 |
| 4,871,324 A | 10/1989 | Brune et al. |
| 4,971,563 A | 11/1990 | Wells, III |
| 5,227,957 A | 7/1993 | Deters |
| 5,315,488 A * | 5/1994 | Le Gallo et al. ........... 361/796 |
| 5,325,270 A | 6/1994 | Wenger et al. |
| 5,873,738 A * | 2/1999 | Shimada et al. ............ 439/61 |
| 5,980,312 A | 11/1999 | Chapman et al. |
| 6,344,975 B1 | 2/2002 | Gayle |
| 6,421,259 B1 | 7/2002 | Brooks et al. |
| 6,425,027 B1 | 7/2002 | Mills et al. |
| 6,462,532 B1 | 10/2002 | Smith |
| 6,496,376 B1 | 12/2002 | Plunkett et al. |
| 6,533,463 B2 | 3/2003 | Doyle |
| 6,587,354 B1 * | 7/2003 | Kutsch et al. .............. 361/788 |
| 6,760,339 B1 * | 7/2004 | Noel et al. .................. 370/401 |
| 2004/0240824 A1 * | 12/2004 | Lipski et al. ............... 385/135 |
| 2005/0259925 A1 * | 11/2005 | Asari et al. ................. 385/89 |
| 2007/0247826 A1 * | 10/2007 | Grady et al. ............... 361/796 |
| 2009/0022469 A1 * | 1/2009 | Zimmel ..................... 385/135 |
| 2009/0041417 A1 * | 2/2009 | Rapp et al. ................. 385/135 |

* cited by examiner

*Primary Examiner*—Dean A. Reichard
*Assistant Examiner*—Abiy Getachew
(74) *Attorney, Agent, or Firm*—Hanify & King, PC

(57) ABSTRACT

A method and apparatus for adapting a backplane from one type of connector to another type of connector is disclosed. The method includes providing a backplane with a plurality of connectors, each connector being of a first type of connector, providing at least one extension module having a plurality of connectors, each connector being of a second type of connector, and plugging the at least one extension module into at least one of the first plurality of first type of connectors, thereby converting the first type of connectors into the second type of connectors. In a preferred embodiment, the backplane is used in a SONET communications system, and the conversion is from DS1 to DS3 connectors. The conversion allows an individual user to begin with one type of connector, and later expand as the need arises to an additional type or types of connectors.

3 Claims, 2 Drawing Sheets

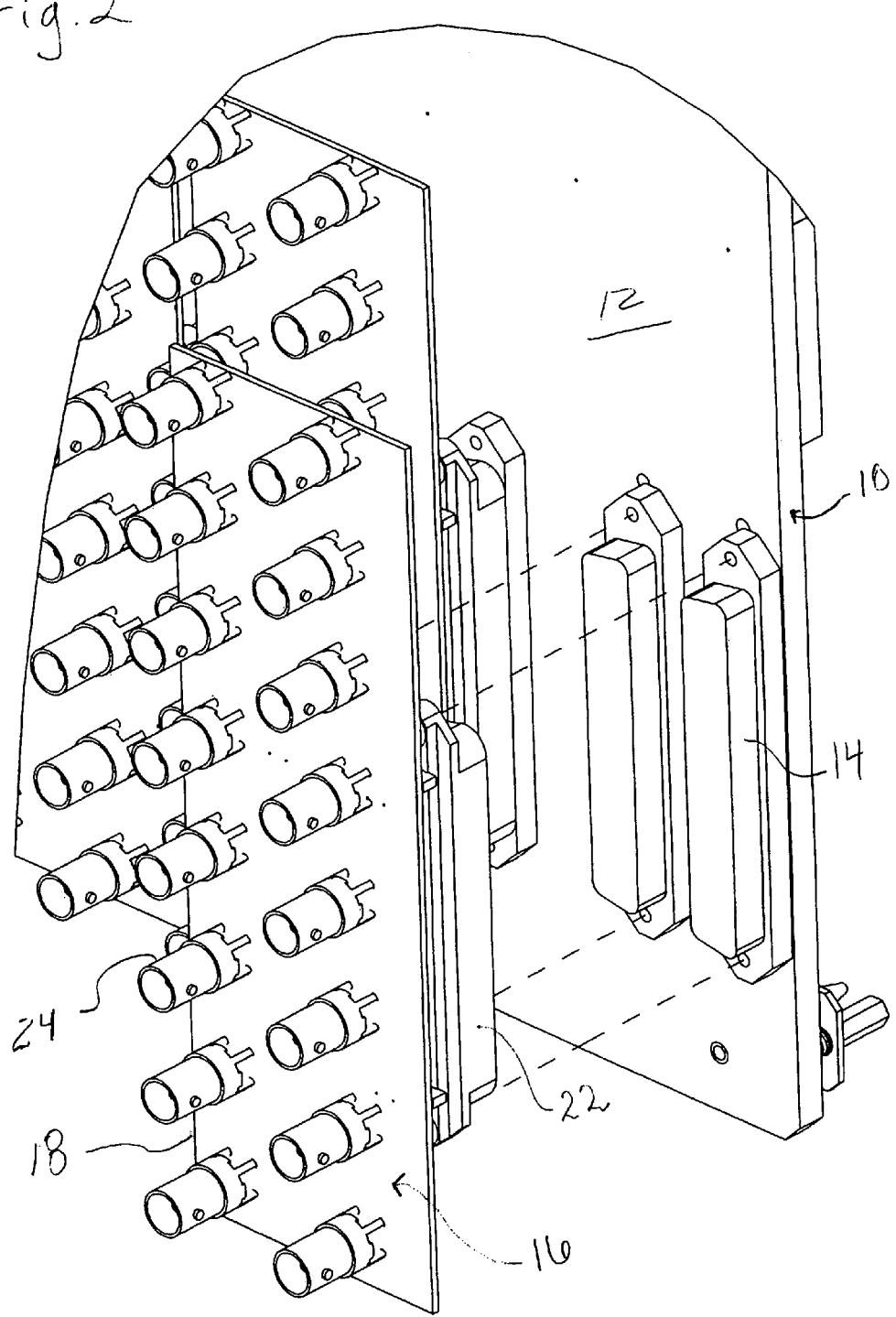

BACKPLANE EXTENSION APPARATUS AND METHOD

BACKGROUND OF THE INVENTION

The present invention relates to backplanes used in electronic devices, such as for components of optical communications systems, and more particularly to backplanes having different types of input and output connectors. The invention provides a cost effective way of changing the layout of input/output connectors depending on individualized customer needs.

DESCRIPTION OF THE RELATED ART

In certain types of communications and/or computer systems it is common to employ modular, electrical components which are adapted to be carried by a rack or other retaining structure. On the front side of the rack or retaining structure, the components are accessible by technicians for replacement, removal, and/or repair.

The backside of the structure is typically where a variety of input and output connectors are provided for connecting the electrical components in a variety of ways. The location of the input and output connectors is often called the "backplane." The word "backplane" is often used to describe similar or analogous structure for a variety of electronic devices. Several types of backplane structures have been created to handle specific needs for a specific electronics component.

U.S. Pat. No. 6,496,376 to Plunkett et al. describes a modular backplane in which a set of modules from which custom passive backplanes can be assembled are coupled in co-planar fashion and are mounted on a rigid base plate which holds them together. On one edge of a CPU module is a connector that communicates with an ISA bus. The connector chains together one or more ISA modules, each of which expands the ISA bus to three more ISA connectors.

U.S. Pat. No. 6,533,463 to Doyle describes an adjustable backplane assembly for providing a fiber-optics backplane interface to a plurality of router cards functioning as a data router. The assembly includes a first portion having a first array of connectors for interfacing with a compatible array of second connectors engaging specific ones of the router cards. The connectors are constructed so that a moveable attachment is provided with respect to the first and second portions so that they may be positionally adjusted during mounting.

U.S. Pat. No. 5,325,270 to Wenger et al. describes a modular backplane in which a flexible backplane assembly is provided. Removable backplane modules are mounted in a platform in a manner such that the backplane modules may be removed and replaced to accommodate different types of circuit modules. Connectors at the rear of each backplane module for mating with circuit module connectors may be electrically connected to input/output boards at the front of the module to permit wiring of the backplane modules from the front of the platform.

U.S. Pat. No. 6,425,027 to Mills et al. describes a modular compact PCI backplane for a computer, in which two or more modular backplane segments each comprise front loading slots for the insertion of peripheral boards. The modular backplane segments include slots on the back side for the insertion of rear mounting boards. Each modular backplane segment includes a PCI compliant bus. The buses of the modular backplanes are bridged by a bridging module that attaches to the back side of the backplane segments being bridged.

Other U.S. patents that show various backplane structures associated with communications and/or computer devices include the following: U.S. Pat. No. 5,980,312 to Chapman, et al.; U.S. Pat. No. 6,421,259 to Brooks, et al.; U.S. Pat. No. 4,971,563 to Wells; U.S. Pat. No. 4,871,324 to Brune, et al.; U.S. Pat. No. 6,462,532 to Smith; U.S. Pat. No. 5,227,957 to Deters; and U.S. Pat. No. 6,344,975 to Gayle.

While each of the above-noted U.S. patents describes a particularly advantageous backplane structure, a continuing need exists for a structure that facilitates greater efficiency and cost effectiveness for individual customers. In particular, backplanes in use presently for SONET optical communications systems typically have connectors provided on the backplane for different types of connections, regardless of whether a customer needs both types of connectors. Thus, every customer receives a backplane with multiple types of connectors, regardless of their needs. This takes up, potentially, large amounts of backplane real estate and adds to the cost, as the connectors typically represent a large percent of the cost of a backplane structure. Thus, customers typically pay for connectors that they may never use.

SUMMARY OF THE INVENTION

The present invention provides for a basic backplane, having one type of connector, which can be augmented subsequently according to individual customer needs through the use of plug-in connectors of a different type.

In one aspect of the invention, a backplane is provided with the most compact connector, such as a DS1 connector. As the customer decides to use other services requiring other connectors, such as DS3, Ethernet, optical, and/or GigE connectors, the invention provides that extension modules of the desired connector type can be procured by the customer and plugged into the pre-existing connectors to convert them to the desired type.

As a result of using extension modules, the basic backplane can be provided with one type of connector and the customer can add additional types only as the need arises. This will save space and cost to the customer.

In another aspect of the invention, a system includes means for adding functionality to an existing system to support a customer's growth. Thus, although the invention includes adding functionality through adapting connectors from one type to another, it also includes adding functionality that did not need a connector. Therefore, the converter also includes adding functionality to an existing system, with or without the use of connectors.

Many of the advantages and features of the present invention will become more apparent in view of the following detailed description and drawings.

BRIEF DESCRIPTION OF THE DRAWINGS

FIG. 2 is detailed view of a portion of FIG. 1, showing details of the connections between the first backplane connectors and the second backplane connectors.

DETAILED DESCRIPTION OF THE PREFERRED EMBODIMENTS

Figure 1:
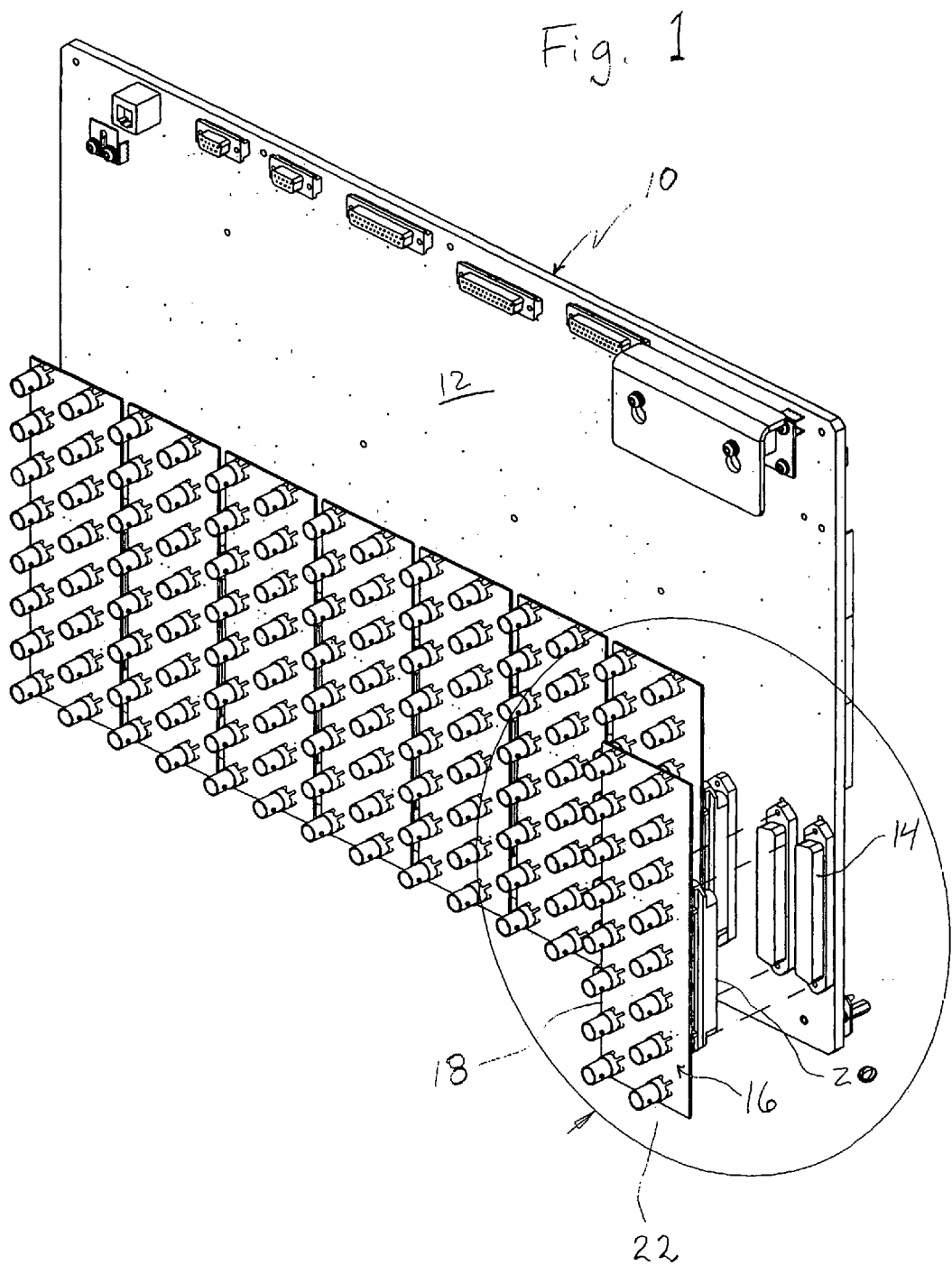
FIG. 1 is a front perspective, exploded view of a backplane assembly of a preferred embodiment of the present invention.

Referring to FIGS. 1 and 2, a backplane 10 of the type generally used for plug-in units of an optical communications system includes an outer surface 12. In the prior art, the outer surface 12 of the backplane 10 would be populated with a plurality of at least two different types of connectors, such as DS1 and DS3 connectors. In FIG. 1, the backplane 10 is shown with a plurality of DS1 connectors 14. As stated above, if a customer had no use for DS3 connections, the DS3 connectors provided on the backplane would be superfluous, unnecessarily adding to cost and taking up valuable space.

According to one embodiment of the invention, the entire backplane would be populated with DS1 connectors 14 (although for ease of illustration, only three such connectors are shown in FIG. 1). For an individual customer, the choice of connectors populating the backplane is determined by what is most likely to be the customer's highest demand connector. Although DS1 type connectors are illustrated as one embodiment, it is conceivable that other connector types could be chosen to be the single type to populate the backplane with.

Once the customer is provided with a backplane with one type of connector, such as the DS1 connectors shown in FIG. 1, the invention provides that connector modules 16 can be coupled to the connectors 14 to convert the connectors of the first connector type to connectors of a second type or third type, or a mix of additional types.

Each connector module 16 includes a printed circuit board 18 having first and second opposite surfaces, two "type one" mating connectors 20 (only one being visible from the view of FIG. 1) which mate with two corresponding "type one" connectors disposed on the backplane 10. The "type one" mating connectors 20 in the illustrated embodiment are disposed on the first or inner surface of the printed circuit board 18, and are designed to mate with the DS1 type connectors 14 provided on the backplane 10. In other embodiments, the "type one" connectors could be virtually any other type of input/output connector.

While two "type one" connectors work for this embodiment, on other embodiments, the first or inner surface of the printed circuit board 18 would have a plurality of "type one" connectors.

The second or outer surface of the printed circuit board 18 is populated with a plurality of "type two" connectors 22, which in the illustrated embodiment are DS3 connectors. In particular, DS3 type connectors 22 are arranged in two rows of eight connectors 22, and are of the form that connect cable to the printed circuit board 18.

Depending on individual customer needs, one or more connector modules 16 could be coupled to the backplane to convert one or more type one connectors to type two connectors. In FIG. 1, eight individual connector modules are shown for illustration purpose, and if all eight were in use, approximately half the backplane would be converted from DS1 connectors (type one) to DS3 connectors (type two). Conceivably, the entire backplane could be converted from type one to type two, if another row of eight connector modules were coupled to an upper set of type one connectors.

Virtually any combination and type of connectors can be used according to the present invention. For example, while the illustrated embodiment focuses on DS1 and DS3 connections, other connector types such as Ethernet (RJ45) could also be provided, either on the initial backplane 10, or on the connector modules 16.

FIG. 2 shows the connector module 16 in greater detail. From FIG. 2 it can be seen that the DS1 connectors 14, which are referred to for illustration purposes as the "type one" connectors, are generally arranged in closely spaced pairs. The mating connectors 22 are shaped physically to receive the protruding portions of the connectors 14 and are wired to electrically mate as well as physically mate with the connectors 14. The connector module 16 includes any necessary wiring and/or components to convert the connectors 22 to connectors 24.

According to the methodology of the present invention, a customer is provided with a backplane 10 having a first type of connector, such as the DS1 connectors illustrated in FIGS. 1 and 2. As a preferred aspect of the invention, the provided backplane has only one type of connector at the time of delivery to the customer. Thus, the backplane will have type one connectors only Either with the initial delivery, or as a subsequent order and delivery, separate backplane connector modules 16 having type two connectors can be provided to convert a subset, or the entire set, of the type one connectors into type two connectors. This is accomplished by simply plugging mating connectors 22 on the inner surface of the connector module 16 into or onto corresponding connectors 14 of the backplane 10. The plug in feature avoids costly technician time and money associated with re-wiring the backplane. Moreover, only the required number of type two connectors will be added to the backplane, so that backplane real estate is used judiciously.

One aspect of the invention includes providing one type of connector on a backplane and converting at least one of the connectors to a type two connector in order to facilitate a different need within the individual user's system. Another aspect would be to convert a backplane having at least two types of connectors into a backplane having at least three types of connectors. The theme of all embodiments is to add a new type of connector to a backplane having a different type or types.

The invention includes providing a basic backplane structure with at least one first type of connector, and providing at least one connector module, adapted to connect to the backplane in a manner to convert the first type of connector to a second type. Thus, the invention provides an assembly that includes a backplane and at least one connector module which converts one connector type to a different connector type.

It does not matter which connector type is provided on the backplane initially. For example, the backplane can be provided with DS1 connector types, and the conversion can be to DS3 or any number of other types. Moreover, the conversion can be made from one type to multiple types. Preferably, however, the backplane is populated initially in a simple and cost effective way, preferably with one type of connector, and more preferably still, the initial connector is a DS1 connector.

From the foregoing it is believed that those skilled in the pertinent art will recognize that while the invention has been described in association with a preferred embodiment thereof, numerous modifications, changes and substitution of equivalents may be made therein without departing from the spirit and scope of this invention which is intended to be unlimited by the foregoing descriptions of a preferred embodiment except as may appear from the following claims.

What is claimed is:

1. An apparatus for converting connectors of one type on a backplane to connectors of another type, comprising:

a printed circuit board having four smaller edges and two larger opposing sides;

a plurality of connectors of a first type disposed on one opposing side of the printed circuit board, the first type of connectors selected to cooperatively mate with a plurality of connectors of the first type disposed on the backplane; and a plurality of connectors of a second type disposed on the other opposing side of the printed circuit board, the second type of connectors being different from the first type of connectors, whereby the printed circuit board plugs into the backplane via mating some of the plurality of connectors of the first type on the backplane to the plurality of connectors of the first type on the printed circuit board, wherein the first type of connectors are DS1 connectors and the second type of connectors are DS3 connectors.

2. An assembly for use in an optical communications system comprising:
   a backplane having connectors of a first type only;
   at least one extension module having connectors of a second type on a first side of the module; and
   means on the second side of the extension module for connecting the extension module, electrically and physically, to at least one of the connectors of the backplane,
   wherein the first type of connectors are DS1 connectors, the second type of connectors are DS3 connectors, and the means for connecting the extension module to the backplane include at least one DS1 connector disposed on a surface of the extension module opposite the DS3 connectors.

3. An assembly for use in an optical communication system comprising:
   a backplane supporting only a first system functionality; and
   means, connected to and configured to cooperatively mate with the first system functionality backplane, for adding at least a second system functionality by changing a first type of connector on the backplane to a second type of connector.

* * * * *